Figure 1:
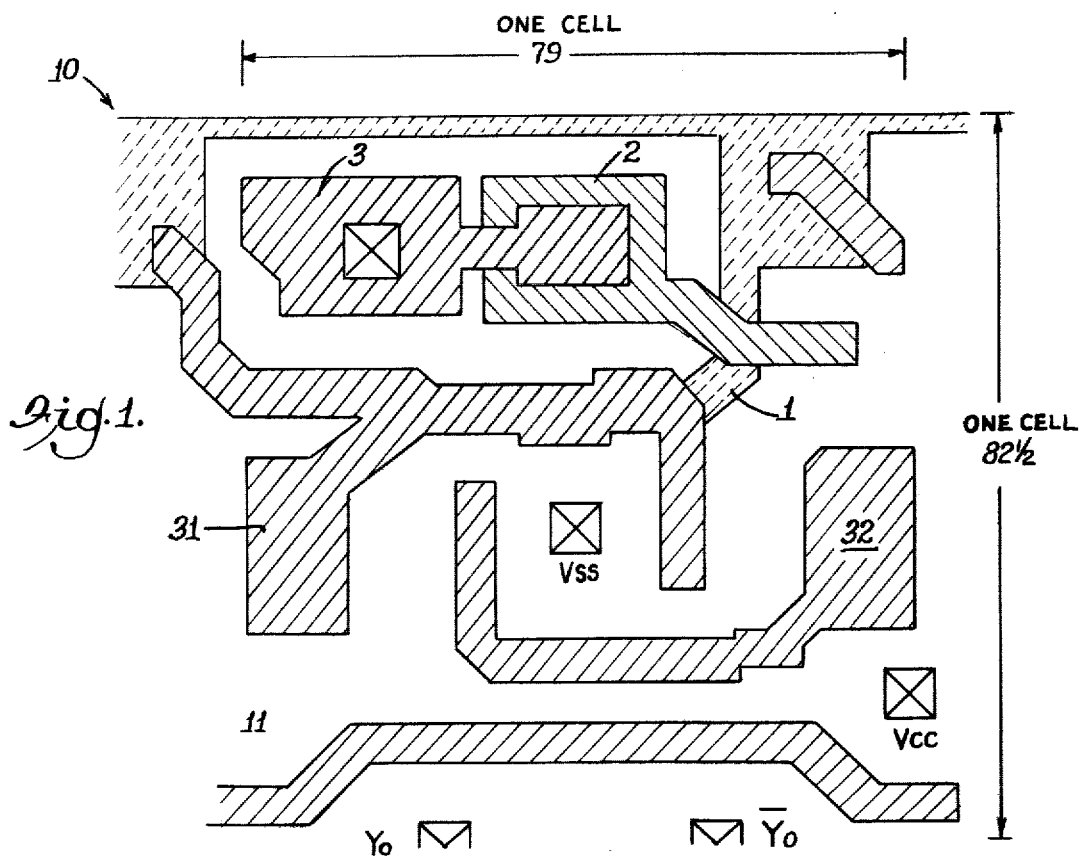

United States Patent [19]

Simko

[11] 4,300,212

[45] Nov. 10, 1981

[54] NONVOLATILE STATIC RANDOM ACCESS MEMORY DEVICES

[75] Inventor: Richard T. Simko, Los Altos, Calif.

[73] Assignee: Xicor, Inc., Los Altos, Calif.

[21] Appl. No.: 6,029

[22] Filed: Jan. 24, 1979

Related U.S. Application Data

[63] Continuation-in-part of Ser. No. 6,030, Jan. 24, 1979.

[51] Int. Cl.³ .............................................. G11C 11/40
[52] U.S. Cl. ...................................... 365/185; 357/23; 365/51
[58] Field of Search ......................... 365/51, 174, 185; 357/23, 24

[56] References Cited

U.S. PATENT DOCUMENTS 4,128,773 12/1978 Troutman et al. ................. 365/185

Primary Examiner—Terrell W. Fears
Attorney, Agent, or Firm—Fitch, Even, Tabin, Flannery & Welsh

[57] ABSTRACT

Nonvolatile, semiconductor random access memory cells comprising a static, RAM cell and a nonvolatile memory element which may be interconnected with the static random-access memory cell by capacitative coupling, such that the RAM cell contents may be directly copied to the nonvolatile element, and such that the nonvolatile memory cell contents will be copied to the RAM cell upon applying power to the RAM cell. The nonvolatile memory element may be a substrate-coupled floating gate cell incorporating self-regulated and asperity enhanced tunnel currents.

13 Claims, 4 Drawing Figures

NONVOLATILE STATIC RANDOM ACCESS MEMORY DEVICES

This application is a continuation in part of my co-pending application Ser. No. 6030 entitled "Substrate Coupled Floating Gate Memory Cells" recently executed and filed on Jan. 24, 1979, which is incorporated herein by reference.

The invention relates generally to the field of metal-oxide semiconductor random access memory systems (MOS RAMs), and more particularly to nonvolatile static RAM systems incorporating an integrated floating gate circuit element.

Many static RAMs employ bistable semiconductor circuits such as flip-flop circuits as memory cells for storing binary data (ones and zeros). For such static memory cells to store information, electrical current from an electrical power source must continually flow in one of the two cross-coupled circuit branches, and be relatively absent from the other branch. Two (binary) distinguishable memory states for information storage are thereby provided, depending upon which branch is conductive, and which branch is correspondingly non-conductive. Accordingly, such semiconductor memory cells are considered to be "volatile" because if electrical power is removed, the memory state distinguishing current will cease to flow in the current carrying branch, and the information in the cell is accordingly lost. Such volatility is a substantial disadvantage of conventional semiconductor memory systems, and substantial effort in the art has been made to develop circuit elements and structures for providing nonvolatility to semiconductor circuits when power is removed [E. Harari, et al., "A 256-Bit Nonvolatile Static RAM", 1978 IEEE International Solid State Circuits Conference Digest, pp. 108–109; F. Berenga, et al. "E$^2$-PROM TV Synthesizer", 1978 IEEE International Solid States Circuit Conference Digest, pp. 196–197; M. Horne, et al., "A military Grade 1024-bit Nonvolatile Semiconductor RAM", IEEE Trans. Electron Devices, Vol. ED-25, No. 8, (1978), pp. 1061–1065; Y. Uchida, et al., "1K Nonvolatile Semiconductor Read/Write RAM", IEEE Trans. Electron Devices, Vol. ED-25, No. 8, (1978), pp. 1065–1070; D. Frohmann, "A Fully-Decoded 2048-Bit Electrically Programmable MOS-ROM", 1971 IEEE International Solid State Circuits Conference Digest, pp. 80–81; U.S. Pat. No. 3,660,819; U.S. Pat. No. 4,099,196; U.S. Pat. No. 3,500,142; Dimaria, et al., "Interface Effects and High Conductivity in Oxides Grown from Polycrystalline Silicon", Applied Phys. Letters (1975), pp. 505–507; R. M. Anderson, et al., "Evidence for Surface Asperity Mechanism of Conductivity in Oxide Grown on Polycrystalline Silicon", J. of Appl. Phys., Vol. 48, No. 11 (1977), pp. 4834–4836].

Devices based on the MOS floating gate structure are conventionally used for systems having prolonged data retention. A floating gate is an island of conducting material, electrically insulated from the substrate but capacitively coupled to the substrate, forming the gate of a MOS transistor. Depending on the presence or absence of charge on this floating gate, the MOS transistor will be rendered conductive ("on") or non-conductive ("off"), thus forming the basis for memory device storage of binary "1" or "0" data corresponding to the presence or absence of floating gate charge. Various means of introducing and removing the signal charge from the floating gate are known. Once the charge is on the gate, it remains permanently trapped, because the floating gate is completely surrounded by an insulating material which acts as a barrier to the discharging of the floating gate. Charge can be introduced onto the floating gate using hot electron injection and/or tunneling mechanisms. Charge can be removed from the floating gate by exposure to radiation (uv light, x-rays), avalanche injection, or by so-called tunneling effects. The term tunneling is used herein in a broad sense to include the emission of an electron from the surface of a conductor into an adjacent insulator through the energy barrier.

Nonvolatile static RAM memories are known which incorporate a floating gate nonvolatile element utilizing very thin gate oxide, but such devices have a number of disadvantages. Charge is tunneled to and from a floating gate element bidirectionally through a relatively thin (50 Angstroms - 200 Angstroms) oxide which may be difficult to reliably manufacture with adequate integrity. Because of the bidirectional character of the very thin tunnel oxide, the nonvolatile RAM cell may be subject to possible disturb problems which cause the memory to lose its contents. In particular, such problems may involve limitations in the number of read cycles, and disturbances in the memory contents of a cell being caused by adjacent cell operations. Other nonvolatile RAM devices do not use floating gates but rather a metal nitride-oxide semiconductor structure in which charge is retained at a silicon nitride, silicon dioxide interface. However, such MNOS devices also have disturb problems which limit not only write cycles but also read cycles, causing limitations on the widespread use of MNOS devices.

It is desirable to interface a nonvolatile element to a RAM circuit to provide nonvolatility in a semiconductor memory array. However, known interfaced devices have various substantial disadvantages. For example, such interfacing may be carried out by introducing a conductance imbalance caused by the nonvolatile element directly between the two branches of a cross-coupled static RAM cell. However, such conductance imbalance causes the cross-coupled static RAM cell to carry a DC offset current which must be overcome when the cell if in normal RAM mode operation, and such imbalances can lead to read and write disturb marginalities for the overall memory circuit. Further, such marginalities present manufacturing yield limitations and testing problems.

Another important factor in respect of interfacing the nonvolatile elements to static RAM cells is providing compactness and simplicity to device design, as these factors affect circuit size and cost. Known interface systems unfortunately tend to require a complex interface in terms of control signals and extra transistors, which has resulted in large nonvolatile static RAM circuit size and correspondingly high cost.

Various known nonvolatile static RAM devices also tend to have the disadvantage of requiring high current demands and high voltages for operation. These requirements place practical limits on device power and speed, and complicate circuit design. Various known nonvolatile static RAM devices also tend to utilize the semiconductor substrate as the principal element in programming the nonvolatile memory components, which may involve application of high voltages to the RAM power line to effect nonvolatile element storage, so that it is difficult to independently optimize and separate the RAM cell design and fabrication process from the nonvolatile element design and fabrication process. Further, when data placed in the nonvolatile storage element is recalled to the RAM cell, the data may be applied to the RAM cell in a complement, or opposite state from that in which it was originally written into the nonvolatile element. Thus, if a binary "0" represented by a conductive first branch and nonconductive second branch of such a conventional flip-flop RAM cell is written to the nonvolatile element, and subsequently is written back to the RAM cell, the first branch of the RAM cell will be nonconductive and the second branch conductive, thereby representing a binary "1". Such complement state recall, rather than direct, true state recall, is a substantial inconvenience which must be handled by extra circuitry or otherwise accounted for by the user of the memory system.

Accordingly, it is an object of the present invention to provide improved nonvolatile static random-access memory cells and memory devices. It is another object of this invention to provide nonvolatile, static RAM devices and memory arrays of such devices which may be conductance or DC balanced, and which may be adapted to provide a capacitive or dynamic imbalance to static RAM cells in the interfacing relationship between static RAM cells and nonvolatile components of the cells. It is another object of this invention to provide nonvolatile static random access memory cells and devices in which a static RAM portion and a nonvolatile portion of the memory cell may be separately optimizable. It is another object of this invention to provide a compact, high-density, nonvolatile, static RAM cell which is relatively simple and inexpensive to manufacture. It is another object of this invention to provide a nonvolatile, static RAM which draws substantially no DC current during programming from the high voltage supply.

Figure 2:
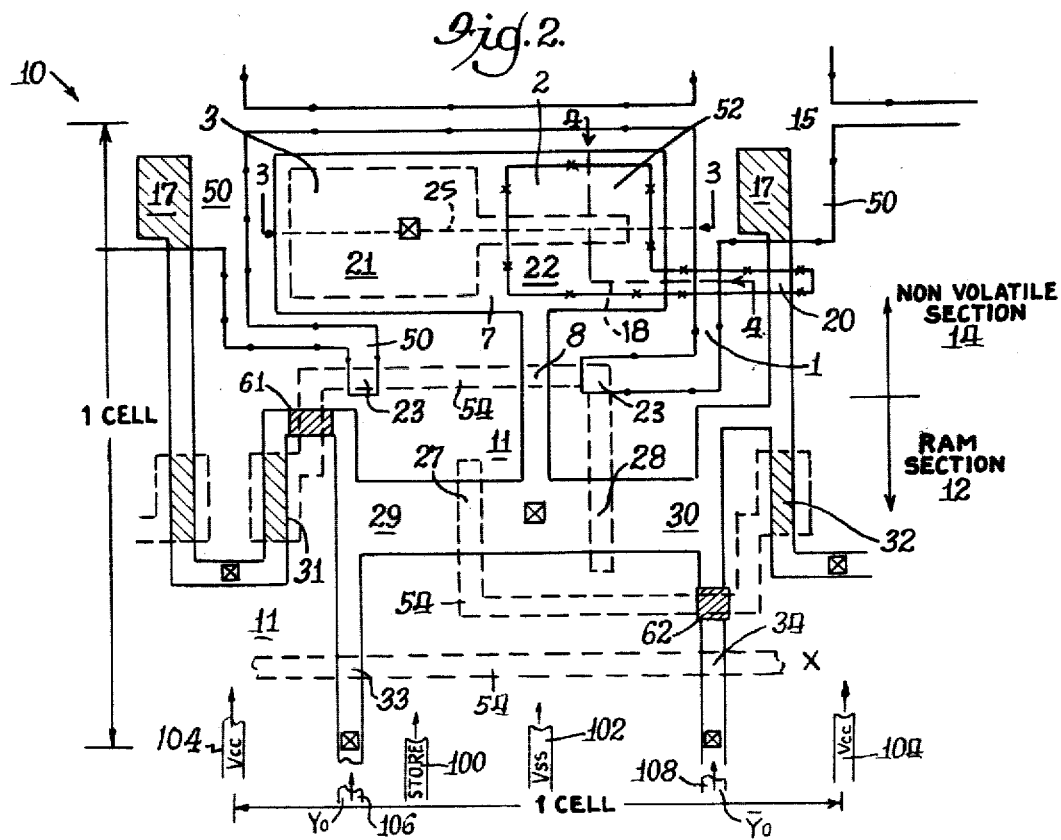
Figure 3:
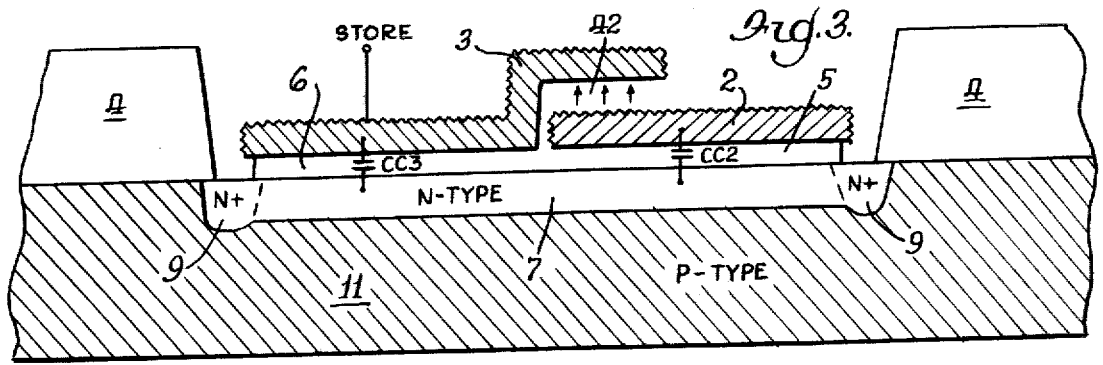
Figure 4:
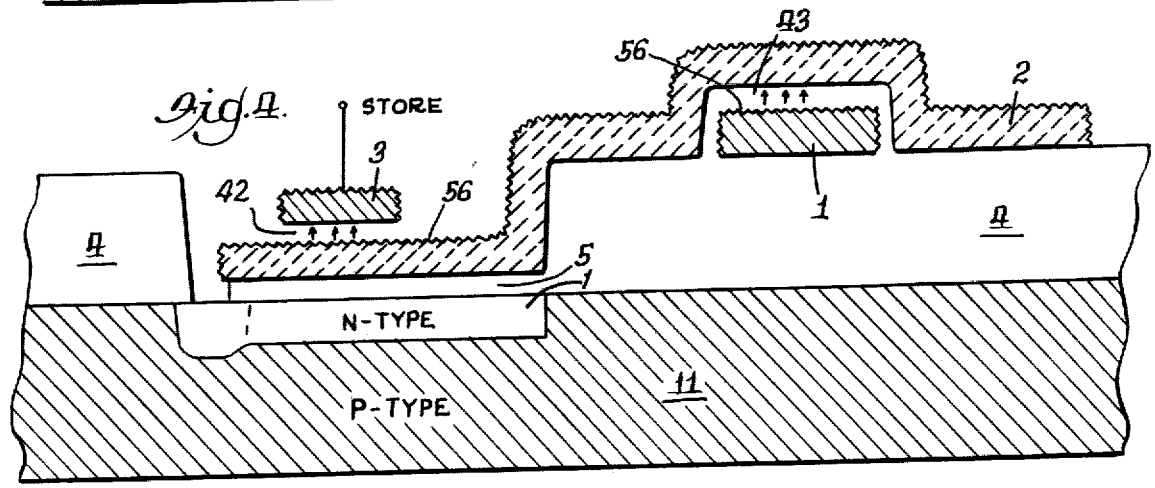
Figure 5:
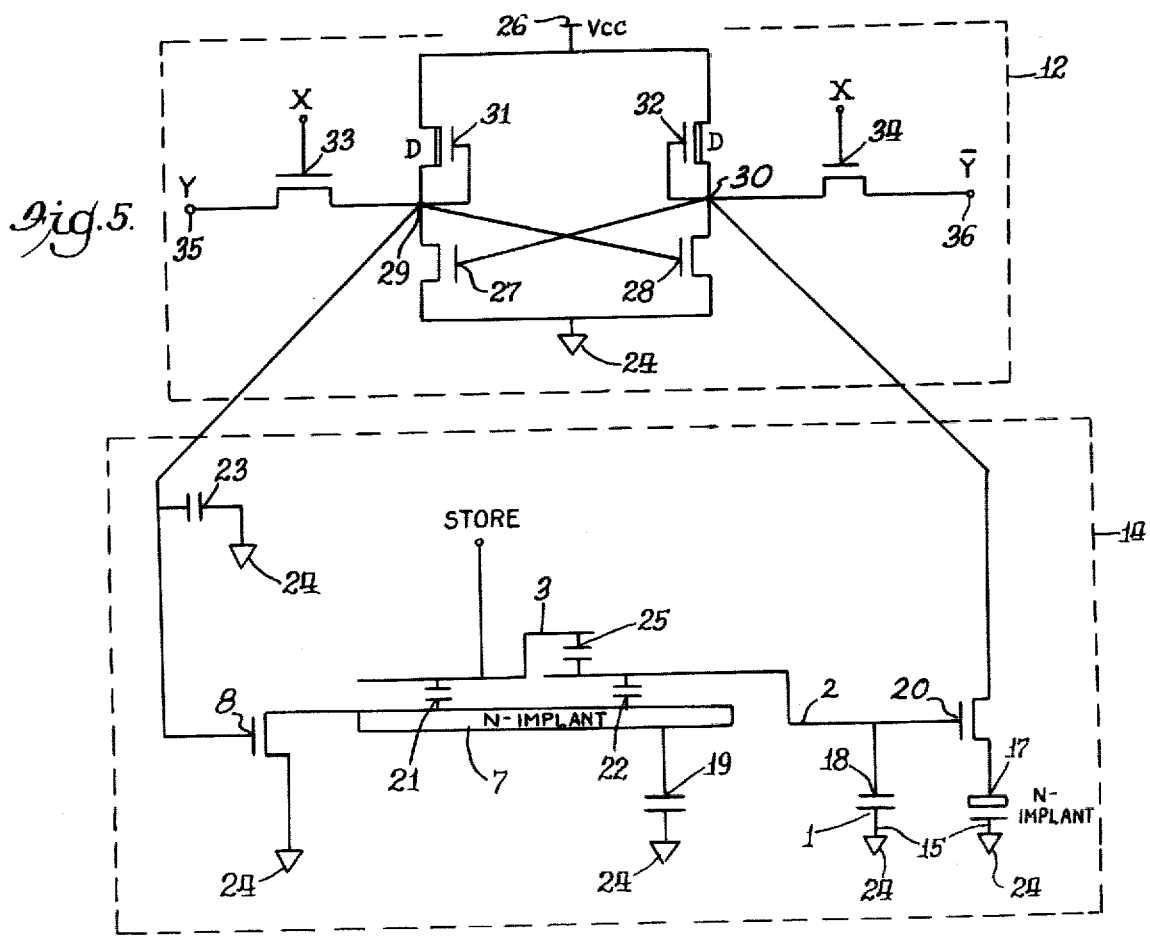

These and other objects of the invention will become apparent from the following detailed description and the accompanying drawings of which:

FIG. 1 is a top view of an embodiment of a nonvolatile static random access memory cell in accordance with the present invention as it appears prior to deposition of metal contacts and interconnections, FIG. 2 is a semi-schematic top view of the nonvolatile cell element of the memory cell of FIG. 1, FIG. 3 is a cross-sectional view of the nonvolatile cell element of FIG. 2 taken through line 3—3 at an intermediate fabrication step;

FIG. 4 is a cross-sectional view of the nonvolatile cell element of FIG. 2 taken through line 4—4 at an intermediate fabrication step, and FIG. 5 is a schematic circuit diagram of the nonvolatile static random access memory cell of FIG. 1.

Generally, the present invention is directed to nonvolatile semiconductor memory devices comprising a volatile semiconductor bistable memory cell for storing binary data as one of two circuit memory states, addressing means for reading binary data from and writing binary data to the bistable volatile semiconductor memory cell, and a nonvolatile memory element for storing binary data as one of two electric charge levels of a floating gate independently of the memory state of the volatile memory cell. The devices further comprise means for capacitatively coupling the volatile memory cell to the floating gate memory element and for copying the memory state of the bistable memory cell to the floating gate element as a predetermined floating gate memory state together with means for capacitatively coupling the floating gate element to the volatile semiconductor memory cell for copying the memory state of the floating gate of the nonvolatile element to the volatile cell upon application of electrical power to the volatile memory cell. The means for copying the memory state of the bistable memory cell to the floating gate element and the means for copying the memory state of the floating gate element to the bistable memory cell are operable such that upon copying an original circuit memory state of the bistable cell into the floating gate element, and subsequently copying the memory state of the floating gate element to the volatile cell, the bistable cell will be returned to its original memory state. The bistable volatile memory cells may desirably be static MOS four of six-transistor, cross coupled flip-flop circuit elements, and the devices in accordance with the invention will desirably be organized in a memory array such as a random access memory array in accordance with conventional practices.

Having generally described the invention, it will now be more particularly described with respect to the specific embodiment illustrated in FIGS. 1–5 of the drawings. Illustrated in FIGS. 1–5 is an embodiment 10 of a nonvolatile, static, random-access memory cell in accordance with the present invention. The illustrated cell 10 comprises a volatile static, bistable flip-flop memory cell 12 and a nonvolatile electrically-alterable floating gate element 14. The illustrated cell 10 forms a part of an x-y addressable random access memory, and accordingly, the volatile memory cell 12 may hereinafter be referred to as a static RAM cell although such cells may also be used in other memory organization designs.

FIG. 1 is a substantially proportionally, accurate top view of the chip circuit design. Various known nonvolatile static RAM devices also tend design of the device 10, which illustrates the polysilicon electrode structure of the device cell. The circuit schematic for the device 10 is shown in FIG. 5 and, for purposes of clarity of description of the invention, the circuit elements of the device 10 of FIG. 1 are shown in somewhat more simplified form in FIGS. 2–4. As shown in FIG. 1, the layout design for the cell 10 is relatively compact, and is adapted to be a unit of a random access array of contiguous like cells, having relative cell dimensions generally as shown, using five micron (metric) design rules, with unit cell dimensions of about 82.5 microns by 79 microns.

In FIG. 2, areas of n-implantation of the silicon substrate 11 are defined by solid line and cross-hatched. Further, in order to illustrate the various polysilicon layers of the overlapping structure of the device 10, the subsequently deposited polysilicon layers are shown by different line designations. In this regard, the first polysilicon layer 50 pattern is shown by solid line marked with additional dots, the second polysilicon layer 52 is shown by solid line with additional "x" markings, and the third polysilicon layer 54 is shown by dashed line. "Buried contact" regions 61, 62 of connection of the polysilicon layer 54 to the n-channel zone are shown by closely dashed lines. In both FIGS. 1 and 2, regions for connection with metallization are shown by crossed squares.

Turning to schematic FIG. 5, the illustrated static RAM cell 12 and the random access array in which it is organized may be of generally conventional design. The RAM cell 12 may be read from and written to by appropriately addressing the cell for sensing or altering its current state in accordance with conventional practice and by means of suitable RAM array connections and chip interfaces, such as store line 100, Vss potential line 102, Vcc potential line 104, Y date line 106, and complement Y data line 108, which are metal lines for carrying power and signals across the array (FIG. 2) which make connection to the individual cells as shown by respective "X" designations in the path of the lines. The Vss potential may be about 0 volts, the Vcc potential may be about 5 volts, and the substrate potential Vbb may be about −3 volts in the illustrated embodiment 10.

The static RAM cell component 12 is coupled to the nonvolatile floating gate element 14 by means of a dynamic, or capacitive imbalance, which coupling provides for storing the current memory content of the volatile static RAM cell 12 in the nonvolatile element 14 upon operator command. Capacitive coupling means is also provided for reading the contents of the nonvolatile floating gate element 14 into the volatile static RAM cell element 12 as desired upon operation of the appropriate circuit elements. The memory content of the static RAM cell 12 and nonvolatile element 14 may normally be independent of each other except on specific copying command. In particular, the current memory content of the RAM cell 10 is not stored into the nonvolatile memory element 14 whenever the RAM cell 12 is written to by the cell addressing and writing means, but rather, the memory content of the static RAM cell is only stored into the nonvolatile element 14 by operation of the capacitive copying circuitry upon specific "store" command, as will be more fully described. In effect the nonvolatile memory element 14 thus appears to the system 10 as a programmable "shadow ROM".

As shown in FIG. 5, the device 10 may comprise a six-transistor static RAM cell 12 of conventional design, and a nonvolatile electrically-alterable floating gate memory element 14. The floating gate memory element 14 is of the type described in my recently executed co-pending Ser. No. 6,030, entitled "Substrate Coupled Floating Gate Memory Cell" which is incorporated herein by reference.

The illustrated random access memory cell 12 is of conventional MOS ram design comprising two cross coupled static inverter circuits combined to form a static, six-transistor flip-flop memory element. In this regard, the RAM memory element 12 comprises cross coupled flip-flop transistors 27, 28 respectively connected to depletion pull-up transistors 31, 32 through respective data nodes 29, 30. Flip-flop transistors 27, 28 are appropriately connected to ground terminal 24, while depletion pull-up transistors 31, 32 are connected to the RAM power supply terminal Vcc. Array ("row" or "word") "X" select transistors 33, 34 are similarly connected to the data nodes 29, 30 for array selection purposes, in the overall memory array of which the device 10 forms a part. The selection of the cell 12 in an array of cells may be accomplished by applying a potential of Vcc to the gate of one of the X address transistors 33, 34 and one of the Y ("column") address lines, which connect to the complementary data output nodes 35, 36, thereby causing the X address transistor to turn on, thus connecting the flip-flop nodes of the addressed call 12 to the "bit" lines, Y and Y of the memory array, in accordance with conventional RAM operation and design practice.

Reading of the addressed cell 12 may be carried out by holding both "bit" lines through high valued resistors to potential Vcc. Depending on the state of the flip-flop (either transistor 27 or 28 will be on and the other will be off) current will flow in one or the other of the "bit" lines and reading may be accomplished by sensing the differential current. Writing to the cell 12 may be accomplished in a conventional manner by addressing a cell 12 as if to read, and holding one "bit" line at potential Vcc while bringing the other "bit" line to the substrate potential Vss.

The cell 12 may thus be accessed through the "word" "X" transistors 33, 34 with Data and complement Data appearing at Y node 35 and Ȳ node 36, respectively. Conventional RAM read/write operations are accordingly performed through data nodes 35 and 36. The cross coupled static flip-flop is formed by transistors 27, 28, 31, 32, having complement states appearing at nodes 29 and 30 as long as power (Vcc) is continuously supplied to terminal 26 of the cell 12.

The construction of the static RAM cell 12 may be carried out by means of commonly known semiconductor processes and photolithography techniques. While a specific static RAM design is shown in the illustrated embodiment 10, it will be appreciated that other suitable designs may also be utilized. For example, in the embodiment 10, transistors 31 and 32 are shown in depletion devices, but in other embodiments, these transistors could be replaced by appropriate resistors.

As indicated, the RAM cel is interfaced with a nonvolatile memory element 14. The illustrated nonvolatile cell element 14 comprises a floating gate 2, means for transfering electrons into the floating gate, and means for removing electrons from the floating gate. The cell element 14 further has an automatic self-regulating circuit configuration which tends to enhance the number of useful write cycles in the nonvoltatile element 14. In operation, transferring electrons onto the floating gate to provide a relatively negative potential memory state on the floating gate, and removing electrons from the floating gate to provide a relatively positive potential memory state, forms the basis for memory storage on the nonvolatile storage device 14. Charge transfer and removal from the floating gate is accomplished by means of electron tunneling, which results in virtually no DC current being drawn from the high voltage programming supply. The small current requirement on the high voltage supply makes possible "on-chip" generation of this voltage, and is a significant advancement in the art. The tunneling current is aided by sharp islandlike asperities which are present in the nonvolatile element, so that relatively thick oxides can be used to separate the tunneling members of the cell and yet draw significant tunneling currents to and from the floating gate at reasonable voltages. Another property of the asperities is that they tend to conduct tunnel current primarily ina singular direction, and do not show symmetric bidirectional current flow properties for reversed fields. A consequence of this is that the the nonvolatile element 14 is relatively immune against loss of memory state by premature, undesired discharge of its electronic charge due to read operation or adjacent cell operation. Since the performance of the illustrated nonvolatile memory element is controlled by tunneling properties between polysilicon elements which are located physically above the substrate (containing the static RAM cell which is largely controlled by phenomena in the substrate), the static RAM and nonvolatile elements can be independently optimized. Therefore, this combination of static RAM cell and nonvolatile element can be easily used with many different technologies.

In carrying out the capacitive coupling, one of the nodes 29 of the RAM cell 12 is capacitively coupled via a capacitance circuit element 23 having a capacitance C1, and transistor 8, to the nonvolatile memory element 14. Complement data node 30 is similarly capacitively coupled to the nonvolatile element 14 by means of transistor 20 to capacitative circuit element 17 having a capacitance C2. The various other circuit coupling elements will be subsequently described in more detail, but is is important to note that the static RAM cell 12 is only capacitively coupled to the non-volatile element 14. No DC offset current load is applied to flip-flop data nodes 29 or 30 by the interface with the nonvolatile element 14 so that the static RAM cell 12 is substantially balanced in the steady state condition. This is an important improvement over the prior art and leads to improved operating margins. Electrode and floating gate structure of the device 10 is shown in FIG. 1, while FIG. 2 illustrates a simplified topographic view of the RAM cell 12 and the nonvolatile element 14 showing the various components to the static RAM cell 12 and nonvolatile electrically-alterable component of the device 10, together with the appropriate relative sizes of the various transistors and capacitance elements. FIGS. 3 and 4 show cross sections of selected elements taken through FIG. 2, following a process step in device fabrication commonly called "source-drain doping" with additional dielectric and metallization layers being utilized to complete the device, in accordance with conventional processing and array design. The structure and operation of the nonvolatile element 14 is generally in accordance with the disclosure of co-pending application Ser. No. 6,030, with several additional elements which form the interface to the static RAM cell 12. The nonvolatile cell 14 in the preferred embodiment 10 utilizes three layers 50, 52, 54 of polysilicon in its fabrication in conjunction with various substrate elements and separating dielectrics. Although the illustrated device 10 including the nonvolatile cell 14 is fabricated in n-channel MOS technology, other fabrication and design approaches may also be utilized.

The illustrated nonvolatile element structure (as shown in FIGS. 2-4 is fabricated on a p-type silicon substrate 11, which further includes a bias elecrode 7 of opposite conductivity type from the substrate 11. The bias electrode may be introduced by conventional techniques such as diffusion or ion implantation. A thermal oxide 4 which may be grown by conventional techniques to be about 12000 Angstroms thick is provided on the substrate 11 for cell isolation purposes. It is subsequently etched in the areas of floating gate and nonvolatile element electrodes and reoxidized to provide thinner oxides 5, 6 to dielectrically isolate the substrate from the three sequentially deposited, patterned (by conventional photolithographic techniques), etched and oxidized polysilicon layers forming the programming electrode 1, the floating gate 2, the erase/store electrode 3 and other circuit elements and interconnecting leads. These thermal oxides 5, 6 separating the polysilicon layers from the substrate are grown by conventional techniques to be about 1000 Angstroms thick in the illustrated embodiment. The values of substrate doping and oxide thickness under the control gates of the various transistors such as coupling transistor 8 may be chosen to give a desired threshold voltage in accordance with conventional design techniques and the gate of transistors such as transistor 8 may be formed from any polysilicon layer, consistent with cell design.

The first polysilicon layer is oxidized at approximately 1000 degrees C. and a similar procedure is performed on the second layer of polysilicon in order to introduce asperities 56 on the upper surfaces of these polysilicon layers as indicated by the serrations in FIGS. 3 and 4. The asperities formed under such conditions may have an areal density of about $5 \times 10^9$ per $cm^2$, an average base width of 456 Angstroms and an average height of 762 Angstroms. The asperities produce vey high fields when relatively low voltages are applied between overlapping or adjacent polysilicon layers. When the asperities are biased relatively negatively, these fileds are sufficient to inject electrons into the relatively thick oxides 42, 43, (having a thickness of 800-1000 Angstroms) while applying on the average a relatively low voltage (e.g., 25 volts or less) across the oxide. When only one adjacent surface of the polysilicon layers has asperities, a diode-like effect is provided because the tunneling of electrons is not enhanced from the flat surface when the asperities are relatively positively biased. Asperities may be generated over a range of conditions and are not limited to the particular example stated above. As indicated, the various layers 50, 52, 54 of polysilicon forming the electrodes and floating gate of the device 10 are insulated from each other by silicon dioxide dielectrics. As shown in 2 3 and 4, the overlapping region 18 between the floating gate 2 and the programming electrode 1 is the area in which electrons tunnel through the separating oxide from the programming electrode to the floating gate when a sufficiently relatively positive voltage is present on the floating gate. The overlapping region 25, between the erase/store gate 3 and the floating gate 2 is the area in which electrons tunnel through the separating oxide 42 from the floating gate when a sufficiently relatively positive voltage is present on the gate 3. Gate 3 overlaps region 7 to form a coupling capacitor 21 of capacitance CC3 determined by the overlap area and the thickness of insulation 6, the voltage difference of the erase/store gate 3 relative to the bias electrode 7 and the doping density N of the bias electrode. The floating gate 2 also overlaps the bias electrode 7, forming a coupling capacitor 22 having a capacitance CC2 determined by the overlap area, thickness of insulation 5, voltage difference of the floating gate 2 relative to the bias electrode 7 and the doping density N. The region 9 is a standard, heavily doped region which is normally formed during the process step that forms the source drain regions of the various transistors. Capacitance element 25 having a capacitance CE, capacitance element 19 having a capacitance Csub, and capacitance element 18 having a capacitance Cp are formulated as shown in the figures, and are realized from properties of various of the structural elements of the device 10. In this connection, split capacitor 23 having a total capacitance C1 is formed between the first polysilicon layer and the third polysilicon layer. This capacitor, plus the capacitance of the gate of transistor 8 causes node 29 to rise slower than node 30 of the RAM cell 12 during the power-up cycle (involving application of power with potential Vcc) provided that transistor 20 is in a nonconductive state. Capacitor 17 having a capacitance C2 is formed between the first polysilicon layer and the substrate area. The total capacitance of capacitance C2 and the gate capacitance of transistor 20 is set to be substantially larger than the total capacitance of capacitance C1 and the gate capacitance of transistor 8, to cause node 30 to rise more slowly than node 29 during powerup. Capacitor 18 having a capacitance Cp is formed between the polysilicon floating gate of transistor 20, and the first polysilicon layer 50. This capacitor provides a structure for tunneling of electrons from the programming electrode 1 of the first polysilicon layer 50, to the floating gate 2. Tunneling occurs when a sufficiently large electric field is developed across the capacitor 18 during "programming". Erase capacitor 25 having a capacitance CE is formed between the erase/store electrode 3 of the third polysilicon layer 54, and the floating gate 2. This capacitor 25 provides a structure for tunneling electrons from the floating gate 2 to the erase/store electrode 3 ("erasing"). Tunneling occurs when a sufficiently large electric field is developed across the capacitor 25. Capacitor 25 also couples some potential to the floating gate during programming. Capacitor 21 having a capacitance of CC3 is formed betwen the erase/store electrode 3 to the substrate n-implanted bias electrode 7. This capacitor provides electric potential coupling to the floating gate 2 through capacitor 22 when transistor 8 is off. Capacitor 22 having a capacitance CC2 is formed between floating gate 2 and the substrate n-implanted area of the bias electrode 7. When transistor 8 is in a nonconducting state, electric potential couples from the erase/store electrode 3 (through capacitor 21) to bias electrode 7, then from the bias electrode 7 to the floating gate 2 (through capacitance 22). If voltage is applied to electrode 3 when transistor 8 is in a conducting state, bias electrode 7 is held at ground potential, and capacitance 22 holds the floating gate potential low so that a large field can develop across capacitor 25. Capacitor 19 having a capacitance Csub is an undesired parasitic p-n junction capacitor which decouples capacitor 22 and capacitor 21 from the erase/store electrode 3 during programming. This capacitor should be minimized. As indicated, transistor 8 is a transistor which senses the state of the RAM cell 12 and instructs the nonvolatile element 14 to "program" or "erase", depending on the memory state of the RAM cell 12, in order to copy the memory state of the RAM cell. Transistor 20 is a transistor which, in turn, communicates the state of the nonvolatile element 14 to the RAM cell 12. The functions of these capacitances and capacitor 21, capacitor 22, capacitor 17 and transistors 8 and 20 will be elaborated upon in the description of the cell operation.

By employing an n-channel silicon gate three-layer polysilicon fabrication process, a manufacturable, compact, easy-to-operate nonvolatile static RAM device 10 may be provided as illustrated which can be used, for example, in microcomputer applications. An array of the memory devices can be used as a conventional RAM with power-down data storage capability ("crash protection"), or as a volatile RAM coexistent with a nonvolatile ROM. The cell can store two independent bits of data, one in the RAM section 12, and one in the nonvolatile section 14 of each cell.

It is important to note that the RAM cell 12 may function independently of the ROM cell 14 and that nonvolatile storage does not necessarily occur with every conventional RAM "write" cycle. Instead, the nonvolatile storage occurs only when a "store" command is given to the memory array. In RAM arrays of the device 10, the arrays may be used as a system for placing a RAM data pattern into the corresponding nonvolatile floating gate elements. In this connection, the corresponding nonvolatile element portion of the array may function as an electrically alterable read only memory (ROM). The nonvolatile element 14 may be referred to as a ROM, for simplicity of reference in the following description. Because data may be stored in the nonvolatile ROM element 14 for future recall to the RAM cell 12, this data storage function may desirably be used for a total power-down situation or other such circumstance in which a conventional RAM would irretrievably lose its data.

Furthermore, because the RAM portion 12 and the ROM portion 14 of the cell 10 are "transparent" to one another, the RAM section can be operated substantially independently of the data state of the ROM section. Because of this feature and because the RAM section copies the true data state of the ROM section upon power-up, an arbitrary starting program such as is conventionally stored in mask programmable ROM memories can be loaded automatically into the RAM array section of a memory array of devices 10 when system power returns. The stored data or program of the ROM may be retained substantially indefinitely for recall to the corresponding RAM cells. In the operation of the device 10 while power at potential Vcc is being supplied to the RAM cell 12, the memory state content of the static RAM section 12 can be copied into the ROM section 14 by applying a single "store" pulse of about 25 volts to the erase/store electrode 3 by means of suitable control circuitry (not shown) which may be of on-chip or off-chip design. When power is removed from the RAM cell 12 the ROM 14 holds that data substantially indefinitely, or until it is altered. When operating power (Vcc) is again applied to the static RAM 12 it automatically nondestructively copies the data of the ROM portion 14. The RAM 12 thus remembers where it "left off" when the power was removed, or more precisely, when the 25 volt "store" command pulse last occurred.

In operation, node 29 of the bistable RAM cell 12 will be either in a higher or in a lower electric potential state, with node 30 having the opposite electric potential state. The capacitive coupling means for coupling the RAM cell 12 to the nonvolatile element 14 is adapted to sense the memory state of the RAM cell 12, and based on such sensing, determines whether to inject electrons onto the floating gate 2 or remove electrons from the gate 2 in order to copy the memory state of the RAM cell 12. In this connection, when node 29 is high, transistor 8 is conductive and the drain of transistor 8 couples the large inversion plate (n-type) of the capacitors 21 and 22 to ground. If the "store" pulse of about 25 V is applied to erase/store electrode 3, an electric field will develop across capacitor 25 which is sufficiently large to tunnel electrons from the floating gate 2 to the electrode 3. The floating gate 2 is in turn the gate of transistor 20. Now, if the entire circuit 10 is "power-down" (all voltage removed) and then RAM supply voltage Vcc is powered back up to approximately 5 volts, the state of the non volatile element 14 will be copied to the RAM cell 12. In this connection, the depletion load transistors 31, 32 will attempt to pull up nodes 29 and 30, respectively. However, because transistor 20 is conductive (its gate is charged positive) and because the capacitance of node 30 plus the capacitance C2 of capacitor 17, plus the gate capacitance of transistor 20 is greater than the capacitance of node 29 plus capacitance C1 of capacitor 23 plus the gate capacitance of transistor 8, node 30 will pull up slower than node 29 in the illustrated embodiment, when node 29 reaches approximately 1 volt, the cross-coupled amplifier will engage and set node 29 high and node 30 low.

On the other hand, when node 29 is initially low, transistor 8 is off (nonconductive) and the large n-inversion plate of capacitors 21, 22 of the bias electrode 7 is allowed to float. If a "store" pulse of about 25 volts is applied, to the erase/store electrode 3, capacitor 21 will couple potential through capacitor 22 to the floating gate 2. Also, the 25 volt "store" voltage pulse will couple somewhat through capacitor 25 to the floating gate 2. The net effect is to produce a large enough field across capacitor 18 to cause electrons to tunnel onto the floating gate 2 from the programming electrode 1 and charge the floating gate negative. With the floating gate negative, transistor 20 will be off (nonconductive).

The entire circuit may then be powered down, and then the Vcc supply may be powered up. As before, transistors 31, 32 attempt to pull up nodes 29, 30 respectively. However, in this case, the capacitance of node 29 plus the capacitance C1 of capacitor 23 plus the gate capacitance of transistor 8 is larger than the capacitance of node 30 (transistor 20 is off). Node 30 will accordingly be slightly higher than node 29 and will accordingly cause the cross-coupled amplifier to engage, setting node 30 high and node 29 low as was the case when previous store pulse command occurred to copy the RAM state to the floating gate element 14.

Accordingly it will be seen that in the operation of the device 10, when the RAM cell 12 is in a certain memory state (node 29 high and node 30 low, or node 29 low and node 30 high) the ROM section 14 will copy that state in such a way that upon power-up the RAM cell section 12 will directly copy back the same state from the ROM section 14.

For recalling data from the nonvolatile ROM cell 14 to the RAM cell 12, when the voltage supply Vcc is powered up (again) various capacitance relationship should be fulfilled. For recalling data to the RAM cell 12 from the ROM cell 14 under circuit conditions when transistor 20 is off, the capacitance C1 of capacitor 23 plus the gate capacitance of transistor 8 should be large enough to insure that node 29 will always pull up more slowly than node 30 and cause the cross coupled amplifier of the RAM cell 12 to set the node 29 low (off), and node 30 high (on).

For recalling data to the RAM cell 12 from the ROM cell 14 under conditions when the transistor 20 is on, capacitance C2 of capacitance 17 plus the gate capacitance of transistor 20 should be sufficiently greater than capacitance C1 of capacitor 23 plus the gate capacitance of transistor 8 to cause the cross coupled amplifier of the RAM cell 12 to set the node 30 low and the node 29 high. Representative capacitance values of these capacitances of the illustrated embodiment 10 are as follows:
  node 29 approximately 0.10 picofarads
  node 30 (with transistor 20 on) approximately 0.20 picofarads
  node 30 (with transistor 20 off) approximately 0.05 picofarads The described nonvolatile static RAM cell also has further advantages due to the presence of a self-regulating and compensation circuit present in the nonvolatile device which tends to increase the number of useful cycles in the nonvolatile device as described in co-pending application Ser. No. 6,030. As indicated, an array of a number of such memory devices may readily be formed on a substrate chip with suitable support circuitry and interconnections to provide a nonvolatile addressable static RAM memory device. The data of the entire RAM section array may be readily copied to the corresponding ROM section array, and recopied to the RAM array upon power up to the RAM array.

While the present invention has been particularly described with respect to the illustrated embodiment, it will be appreciated that various alterations, modifications and adaptations may be made based on the present disclosure, and are intended to be within the spirit and scope of the present invention.

Various of the features of the invention are set forth in the following claims.

What is claimed is:

1. A nonvolatile memory device comprising a volatile semiconductor memory cell for storing binary data, means for reading from and writing to said volatile memory cell, a nonvolatile memory means, comprising an electrically insulated floating gate conductor, for storing binary data as one of two different electric charge levels on said floating gate conductor, means for capacitively coupling said volatile memory cell to said nonvolatile memory means and for copying the memory state of said bistable memory cell to the floating gate conductor at a predetermined one of said electric charge levels, and means for capacitively coupling said floating gate conductor of said nonvolatile memory means to the said volatile memory cell for copying the memory state of said floating gate to said volatile memory cell upon application of electrical power to said volatile memory cell.

2. The cell of claim 1 in which the volatile memory cell is a bistable cross-coupled flip-flop memory cell.

3. The cell of claim 1 in which the memory cell is a six-transistor n-channel static random-access memory cell.

4. The cell of claim 1 in which the memory cell is a four-transistor n-channel static random-access memory cell.

5. A cell in accordance with claim 1 in which said memory cell is a six-transistor CMOS/SOS static random-access memory cell.

6. The cell of claim 1 in which said memory cell is a six-transistor bulk CMOS static random-access memory cell.

7. A cell in accordance with claim 1 wherein the nonvolatile memory means comprises a plurality of electrodes and wherein at least two of said electrodes and said floating gate are constructed with three layers of polysilicon.

8. A cell in accordance with claim 1 wherein asperities are provided to promote electron flow to and from said floating gate conductor component of said nonvolatile memory means.

9. A cell in accordance with claim 1 wherein said means for copying the memory state of said cell to said floating gate conductor includes an electrode positioned capacitively adjacent said floating gate conductor, such that application of a single "store" voltage control signal to said electrode causes the present memory state of said volatile memory cell to be transferred into said nonvolatile memory means.

10. A cell in accordance with claim 1 in integrated circuit array with a plurality of like cells.

11. A method for nonvolatile storage of binary information in a semiconductor integrated circuit, comprising the steps of capacitively sensing the one of two binary memory states of a volatile semiconductor memory cell having binary information stored therein, causing a predetermined one to two electric charge levels to be created on a dielectrically isolated floating gate conductor corresponding to said one capacitively sensed memory state of said volatile memory cell without altering the memory state of said volatile memory cell, and causing said volatile memory cell to capacitively sense the current charge level of said floating gate when power is first coupled to said volatile memory cell, such that the memory state of said volatile memory cell corresponds to said charge level of said floating gate.

12. The cell of claim 1 wherein said means for reading from and writing to said volatile memory cell comprises a single erase/store gate capacitively coupled to said floating gate conductor wherein a single positive polarity voltage enables both the charging and discharging of such floating gate conductor.

13. A method in accordance with claim 11 wherein the step of providing a predetermined one of two electric charge levels on said floating gate conductor comprises the step of coupling a single positive polarity voltage to an erase/store gate capacitively coupled to said floating gate conductor.

* * * * *